(12) United States Patent
Lee et al.

(10) Patent No.: US 10,553,756 B2
(45) Date of Patent: Feb. 4, 2020

(54) LIGHT EMITTING DEVICE

(71) Applicant: LG INNOTEK CO., LTD., Seoul (KR)

(72) Inventors: Jong Sub Lee, Seoul (KR); Hyun Don Song, Seoul (KR); Ki Man Kang, Seoul (KR); Seung Hwan Kim, Seoul (KR); Sung Dal Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/764,961

(22) PCT Filed: Sep. 30, 2016

(86) PCT No.: PCT/KR2016/011024
§ 371 (c)(1),
(2) Date: Mar. 30, 2018

(87) PCT Pub. No.: WO2017/057977
PCT Pub. Date: Apr. 6, 2017

(65) Prior Publication Data
US 2018/0287013 A1    Oct. 4, 2018

(30) Foreign Application Priority Data

Sep. 30, 2015  (KR) .................... 10-2015-0137808

(51) Int. Cl.
*H01L 33/22*   (2010.01)
*H01L 33/50*   (2010.01)
(Continued)

(52) U.S. Cl.
CPC .............. *H01L 33/22* (2013.01); *H01L 33/50* (2013.01); *H01L 33/502* (2013.01); *H01L 33/58* (2013.01); *H01L 33/14* (2013.01); *H01L 33/32* (2013.01)

(58) Field of Classification Search
CPC ......... H01L 33/58; H01L 33/32; H01L 33/22; H01L 33/20; H01L 33/30; H01L 33/502; H01L 33/50
See application file for complete search history.

(56) References Cited

U.S. PATENT DOCUMENTS 6,455,877 B1 *  9/2002  Ogawa et al. ........ H01L 33/025
                                                        257/101
2005/0121688 A1 *  6/2005  Nagai ..................... H01L 33/02
                                                        257/99
(Continued)

FOREIGN PATENT DOCUMENTS

JP    2002-368261    12/2002
JP    2008-192900    8/2008
(Continued)

OTHER PUBLICATIONS

International Search Report and Written Opinion dated Dec. 28, 2016 issued in Application No. PCT/KR2016/011024 (with English Translations).

*Primary Examiner* — Feifei Yeung Lopez
(74) *Attorney, Agent, or Firm* — KED & Associates, LLP

(57) ABSTRACT

An embodiment of the present invention includes: a gallium nitride substrate; and a light-emitting structure disposed on the other surface of the substrate, wherein the substrate includes a plurality of light extraction structures formed on one surface thereof, the thickness of the substrate is 80 μm or more, and the average height of the plurality of light extraction structures is 10 μm or more.

17 Claims, 10 Drawing Sheets

(51) Int. Cl.
  *H01L 33/58* (2010.01)
  *H01L 33/14* (2010.01)
  *H01L 33/32* (2010.01)

(56) References Cited

U.S. PATENT DOCUMENTS

| | | | | |
|---|---|---|---|---|
| 2006/0060868 | A1* | 3/2006 | Orita | B82Y 20/00 257/84 |
| 2006/0157717 | A1* | 7/2006 | Nagai | H01L 33/025 257/81 |
| 2011/0012154 | A1* | 1/2011 | Okagawa | H01L 33/22 257/98 |
| 2012/0025251 | A1* | 2/2012 | Kazama | H01L 33/20 257/98 |
| 2013/0119424 | A1* | 5/2013 | Kang | H01L 33/20 257/98 |

FOREIGN PATENT DOCUMENTS

| | | |
|---|---|---|
| JP | 2009-200522 | 9/2009 |
| KR | 10-2013-0054041 | 5/2013 |
| KR | 10-2013-0117474 | 10/2013 |

* cited by examiner

LIGHT EMITTING DEVICE

CROSS-REFERENCE TO RELATED PATENT APPLICATIONS

This application is a U.S. National Stage Application under 35 U.S.C. § 371 of PCT Application No. PCT/KR2016/011024, filed Sep. 30, 2016, which claims priority to Korean Patent Application No. 10-2015-0137808, filed Sep. 30, 2015, whose entire disclosures are hereby incorporated by reference.

TECHNICAL FIELD

The present invention relates to a light-emitting device.

BACKGROUND ART

A light emitting diode (LED) device is a compound semiconductor device which converts electrical energy into light energy. The LED may implement various colors by adjusting a composition ratio of a compound semiconductor.

When compared to existing light sources such as a fluorescent lamp and an incandescent lamp, a nitride semiconductor LED has advantages, such as lower energy consumption, semi-permanent life span, rapid response speed, stability, and environmental friendliness. Accordingly, an application range of the nitride semiconductor LED has been extended to LED backlights capable of replacing a cold cathode fluorescent lamp (CCFL) constituting a backlight of a liquid crystal display (LCD) device, white LED lighting devices capable of replacing a fluorescent lamp or an incandescent lamp, vehicle headlight, and signal lamps.

Generally, a gallium nitride-based LED is grown on a sapphire substrate. However, since a sapphire substrate is hard and electrically nonconductive and has low thermal conductivity, a sapphire substrate faces limitations in reducing manufacturing costs through size reduction of the gallium nitride-based LED and improving light output and characteristics of a chip.

In existing InGaN LEDs grown on a sapphire substrate, a silicon carbide substrate, a silicon substrate, and the like, a droop phenomenon in which internal quantum efficiency decreases as current density increases may occur, and reliability problems such as current crowding may occur.

Therefore, in order to develop an LED having characteristics such as high efficiency and high current, there is a need to develop an LED using a GaN bulk substrate having a small lattice mismatch and low dislocation density.

DISCLOSURE

Technical Problem

The present invention is directed to providing a light-emitting device using a GaN substrate.

Technical Solution

One aspect of the present invention provides a light-emitting device including a gallium nitride substrate and having one surface and another surface, and a light-emitting structure disposed on the one surface of the substrate, wherein the substrate has a plurality of light extraction structures disposed on the other surface thereof, a thickness of the substrate is 80 µm or more, and an average height of the plurality of light extraction structures is 10 µm or more.

The substrate may have a first region in which the plurality of light extraction structures are formed, and a second region between the plurality of light extraction structures.

The second region may have an even surface.

An area of the first region may be 60% or more of a total area of the substrate.

An area of the first region may be 90% or more of a total area of the substrate.

The plurality of light extraction structures may have a hexagonal shape.

A bottom side and a side surface of each of the plurality of light extraction structures may have the same angle of incline.

An average height of the plurality of light extraction structures may be 30 µm or less.

The substrate may have a plurality of sub-light extraction structures formed on side surfaces in a thickness direction thereof.

The substrate may have stepped portions disposed on the side surfaces of the light-emitting structure, and each of the plurality of sub-light extraction structures may be disposed on an upper surface of each of the stepped portions.

The substrate may include a first layer facing the light-emitting structure, a second layer having the plurality of light extraction structures, and a third layer disposed between the first layer and the second layer, wherein a doping concentration of the third layer is lowest.

A doping concentration of the first layer may be in a range of $1 \times 10^{18}$ cm$^{-3}$ to $5 \times 10^{19}$ cm$^{-3}$.

A doping concentration of the second layer may be in a range of $1 \times 10^{18}$ cm$^{-3}$ to $5 \times 10^{19}$ cm$^{-3}$.

The doping concentration of the third layer may be $1 \times 10^{16}$ cm$^{-3}$ or less.

Advantageous Effects

According to an exemplary embodiment, a lattice mismatch can be prevented by using a GaN substrate.

In addition, it is possible to increase light extraction efficiency and emission efficiency.

The various and advantageous advantages and effects of the present invention are not limited to the above description, and may be more easily understood in the course of describing a specific exemplary embodiment of the present invention.

MODES OF THE INVENTION

Figure 1:
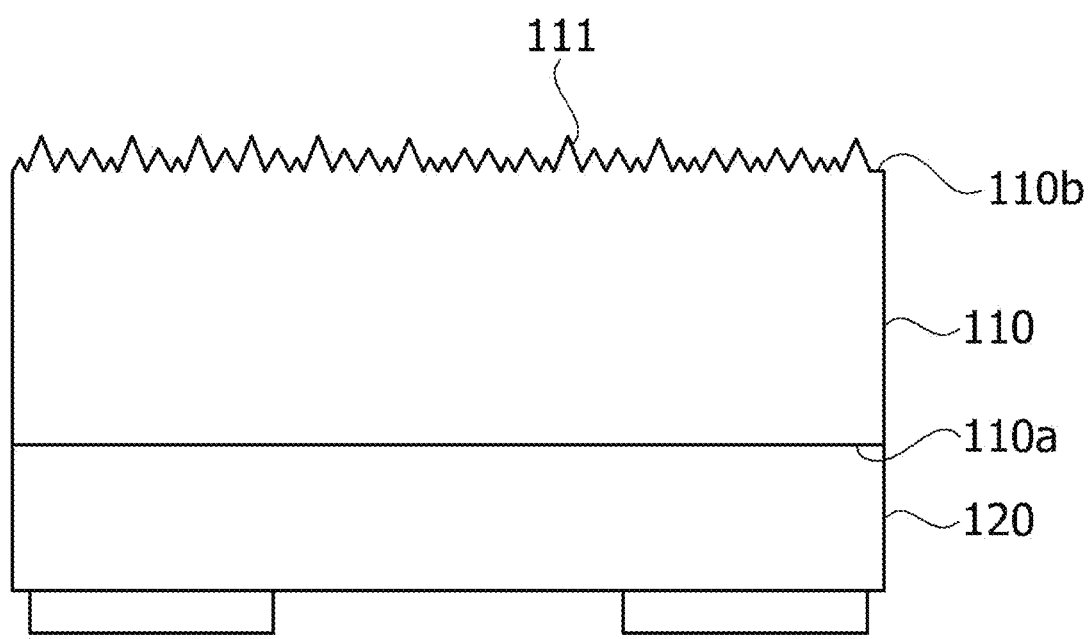
FIG. 1 is a conceptual view illustrating a light-emitting device according to an exemplary embodiment of the present invention.

While the present invention is open to various modifications and alternative embodiments, specific embodiments thereof will be described and shown by way of example in the drawings. However, it should be understood that there is no intention to limit the present invention to the particular embodiments disclosed, and, to the contrary, the present invention is to cover all modifications, equivalents, and alternatives falling within the spirit and scope of the present invention.

It should be understood that, although terms including ordinal numbers such as "first," "second," and the like may be used herein to describe various elements, the elements are not limited by the terms. The terms are only used to distinguish one element from another. For example, a second element could be termed a first element without departing from the scope of the claims of the present inventive concept, and similarly a first element could be also termed a second element. The term "and/or" includes any and all combinations of a plurality of associated listed items.

The terminology used herein is for the purpose of describing particular embodiments only and is not intended to limit the present inventive concept. A single form of expression is meant to include multiple elements unless otherwise stated. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components.

It should be understood that, when an element is referred to as being "on" or "under" another element, the element may be directly on/under the other element, and/or one or more intervening elements may also be present. When an element is referred to as being "on" or "under" another element, the meaning thereof may include the element being "on the other element" as well as being "under the other element."

Hereinafter, example embodiments will be described with reference to the attached drawings, and the same or corresponding elements will be given the same reference numbers regardless of drawing symbols, and redundant descriptions will be omitted.

Figure 2:
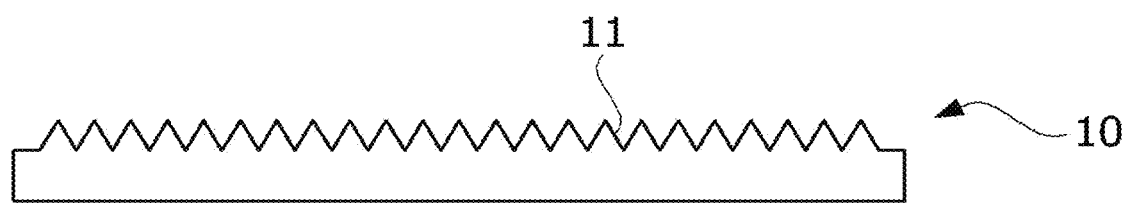
FIG. 2 is a conceptual view illustrating an existing GaN substrate.
Figure 3A:
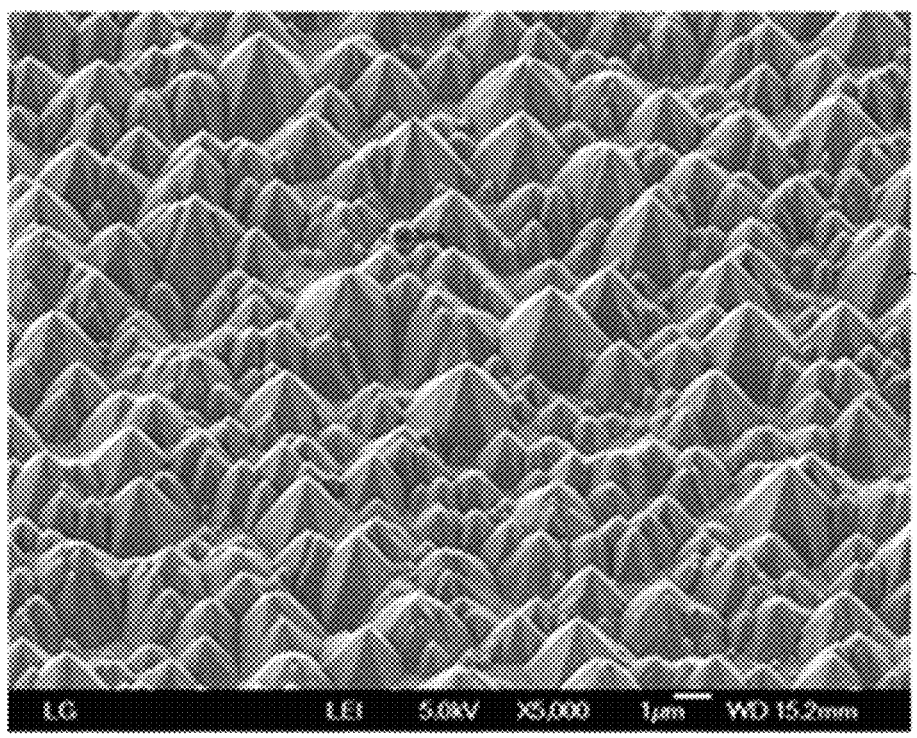
FIGS. 3A to 3C are images showing existing light extraction structures having various shapes.
Figure 3B:
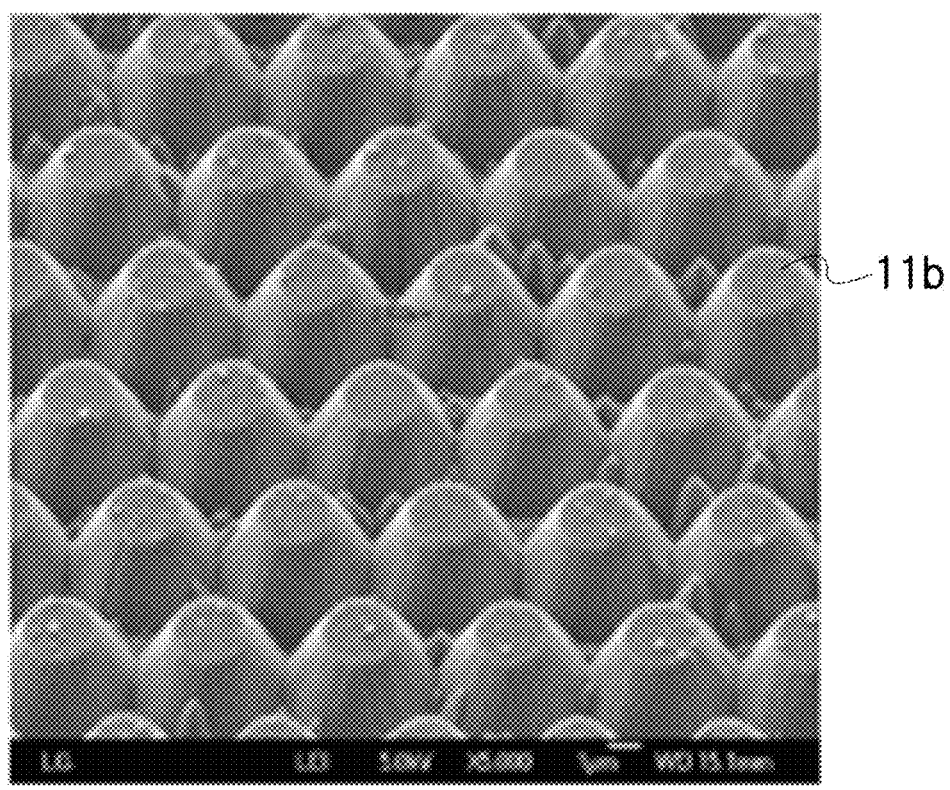
Figure 3C:
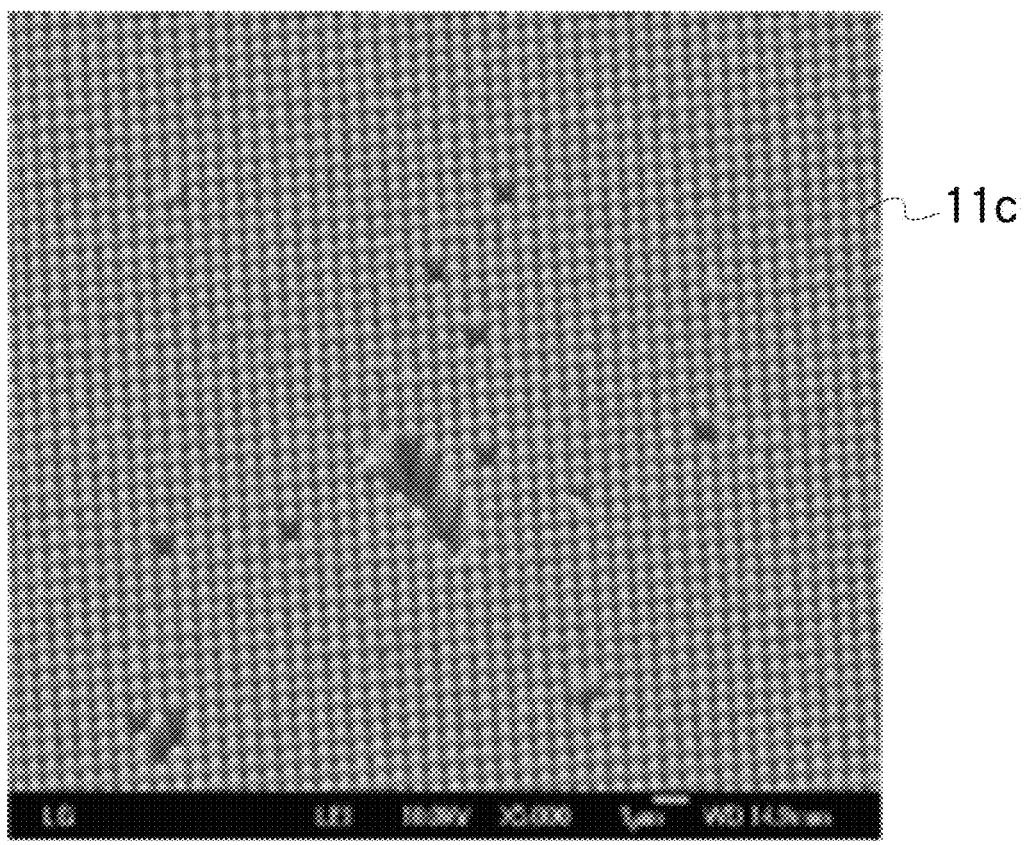
Figure 4:
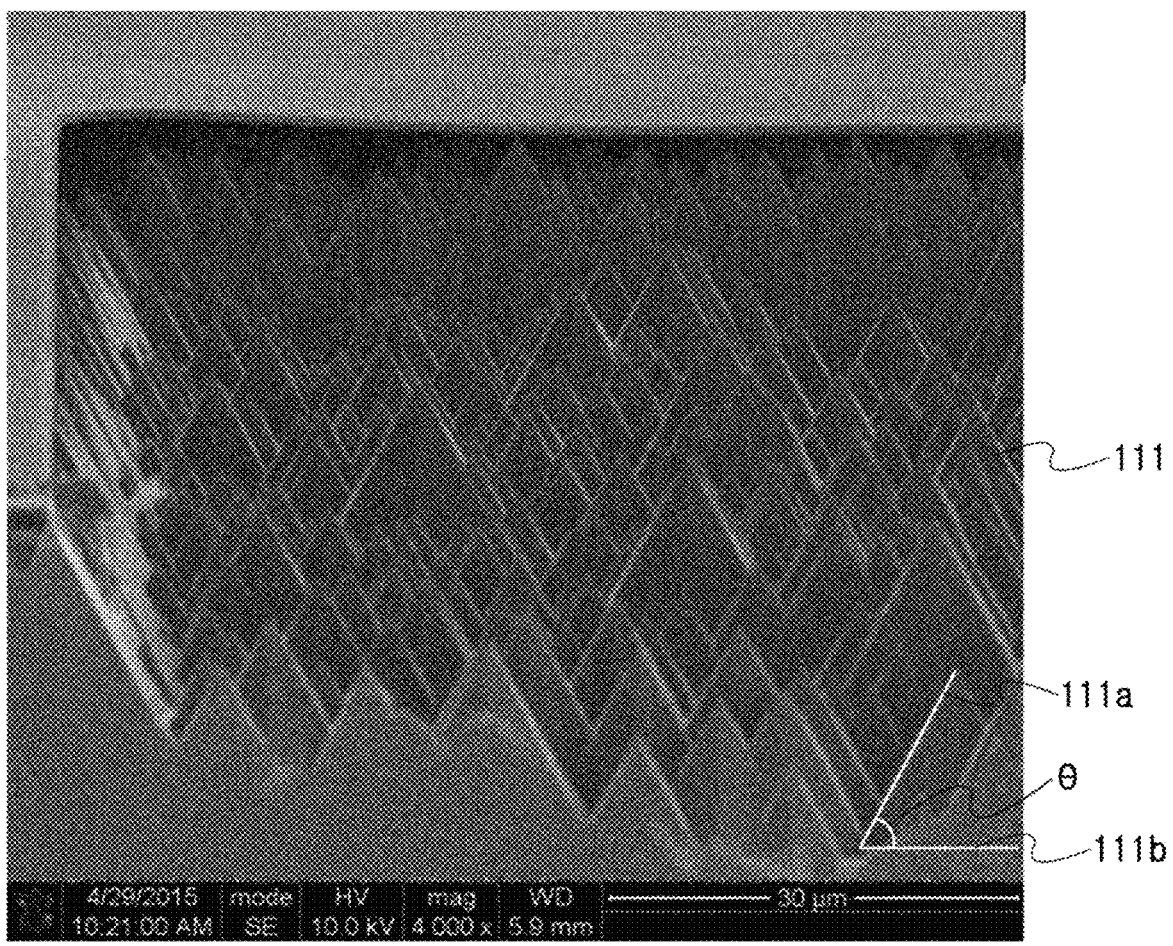
FIG. 4 is an image showing light extraction structures of FIG. 1.

FIG. 1 is a conceptual view illustrating a light-emitting device according to an exemplary embodiment of the present invention. FIG. 2 is a conceptual view illustrating an existing GaN substrate. FIGS. 3A to 3C are images showing existing light extraction structures having various shapes. FIG. 4 is an image showing light extraction structures of FIG. 1.

Referring to FIG. 1, the light-emitting device according to the exemplary embodiment includes a gallium nitride (GaN) substrate 110 having one surface 110a and the other surface 110b and a light-emitting structure 120 disposed on one surface 110a of the substrate 110.

The substrate 110 may be manufactured by growing gallium nitride (GaN). A lattice mismatch is formed due to a lattice constant mismatch between a generally used sapphire substrate and a gallium nitride-based semiconductor layer. A strong piezoelectric filed is applied to the light-emitting structure 120 by the lattice mismatch, reducing quantum efficiency.

According to an exemplary embodiment, problems caused by the lattice mismatch can be solved using the gallium nitride substrate 110. In addition, a buffer layer for preventing the lattice mismatch may be omitted. Hereinafter, the gallium nitride substrate will be defined as a substrate for convenience.

The substrate 110 has one surface 110a and another surface 110b. The other surface 110b may be an N-surface, and the one surface 110a may be a Ga-surface. The substrate 110 may have a plurality of light extraction structures 111 formed on the other surface thereof.

The substrate 110 may have a thickness of 80 μm to 300 μm. When the thickness is less than 80 μm, warpage may occur in the substrate 110 during epitaxial growth and cause a device defect, and when the thickness is greater than 300 μm, a dopant may be difficult to uniformly control in the substrate.

The light extraction structures 111 may have a height of 10 μm to 30 μm. When the height is less than 10 μm, a light extraction structure may not be formed in some regions, and thus, light may not be extracted. When the height is greater than 30 μm, light extraction efficiency may not be further increased. The plurality of light extraction structures 111 may have different heights.

The light extraction structures 111 may be formed using a basic solution such as KOH or NaOH. In an example, double-boiling may be performed at a temperature of 70° C. to 80° C. using 45% KOH, and then the substrate 110 may be immersed in a double-boiled KOH solution to form an unevenness. However, a method of forming the light extraction structures 111 is not particularly limited.

Referring to FIG. 2, when the thickness of the GaN substrate 10 is 10 μm, the height of the light extraction structures 111 may be in a range of 1 μm to 5 μm. The light extraction structures 111 have various shapes such as a random shape 11a as shown in FIG. 3A, a micro rod shape 11b having a flat upper surface as shown in FIG. 3B, and a nano rod shape 11c as shown in FIG. 3C. Since all of the light extraction structures having such shapes have only a height of 0.6 μm to 3.0 μm, the light extraction structures may not have a light extraction effect when the thickness of the substrate exceeds 80 μm.

Referring to FIG. 4, the light extraction structures 111 according to an exemplary embodiment may have a height of 10 μm to 30 μm. The height of the light extraction structures may be defined as a vertical distance between a bottom and a top of an inclined surface. The plurality of light extraction structures 111 may have different heights.

The plurality of light extraction structures 111 may have a substantially hexagonal shape, both angles of incline Θ of a bottom side 111b and a side surface 111a of each of the plurality of light extraction structures 111 may be the same as each other. The angles of incline Θ may be in a range of 50° to 60°. However, the present invention is not necessarily limited thereto, and the angles of incline Θ of the bottom side 111b and the side surface 111a may be different from each other.

Figure 5:
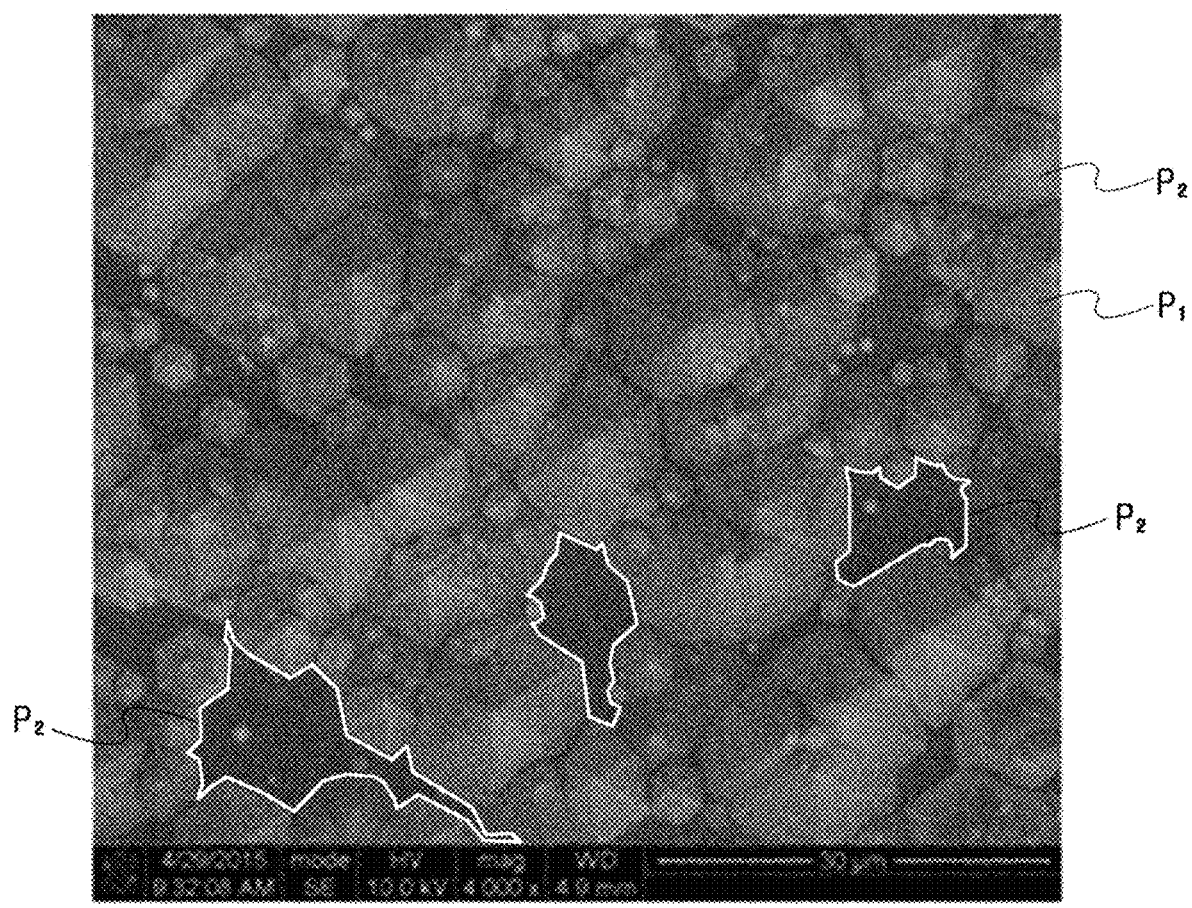
FIG. 5 is an image showing a case in which an area of light extraction structures is less than 60% of a total area of a substrate.
Figure 6:
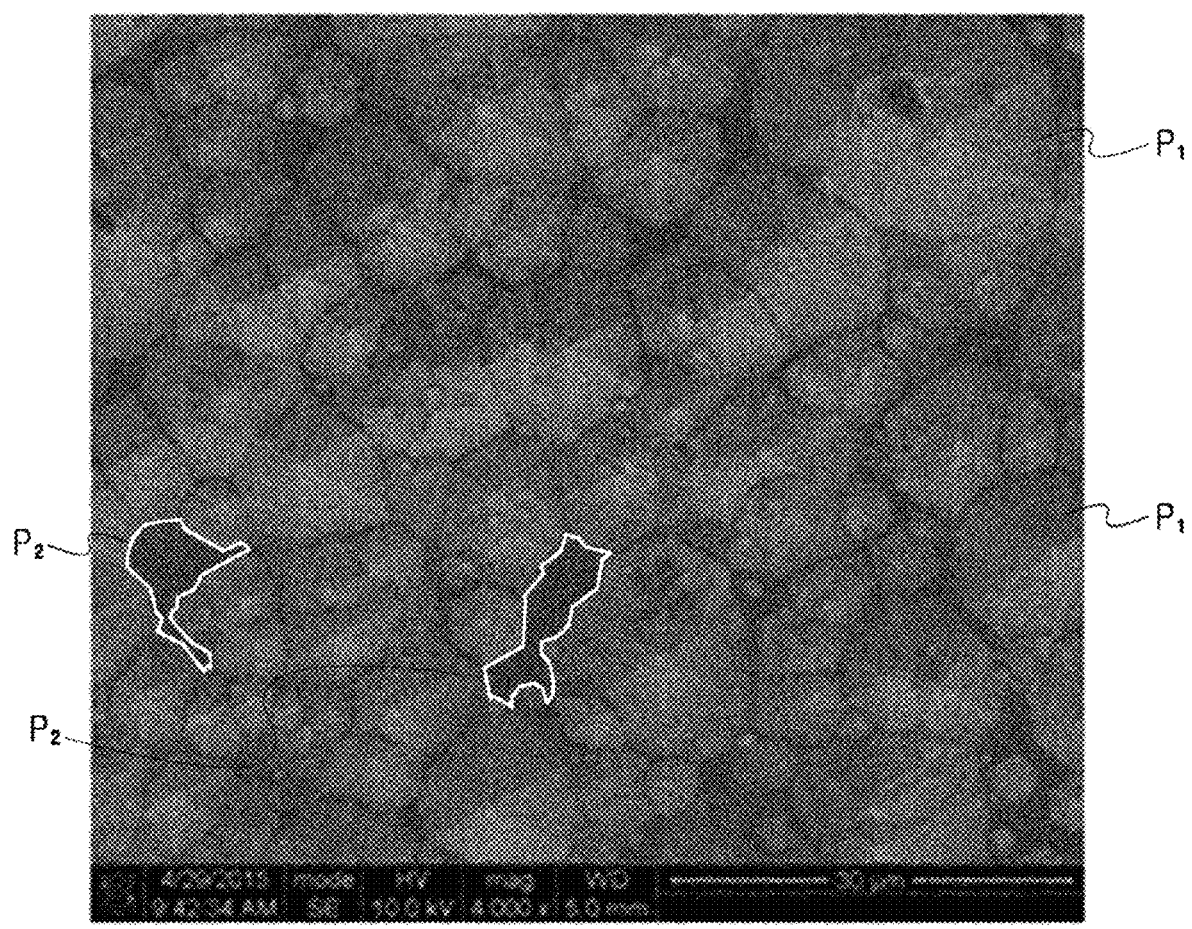
FIG. 6 is an image showing a case in which the area of the light extraction structures is 60% or more and less than 90% of the total area of the substrate.
Figure 7:
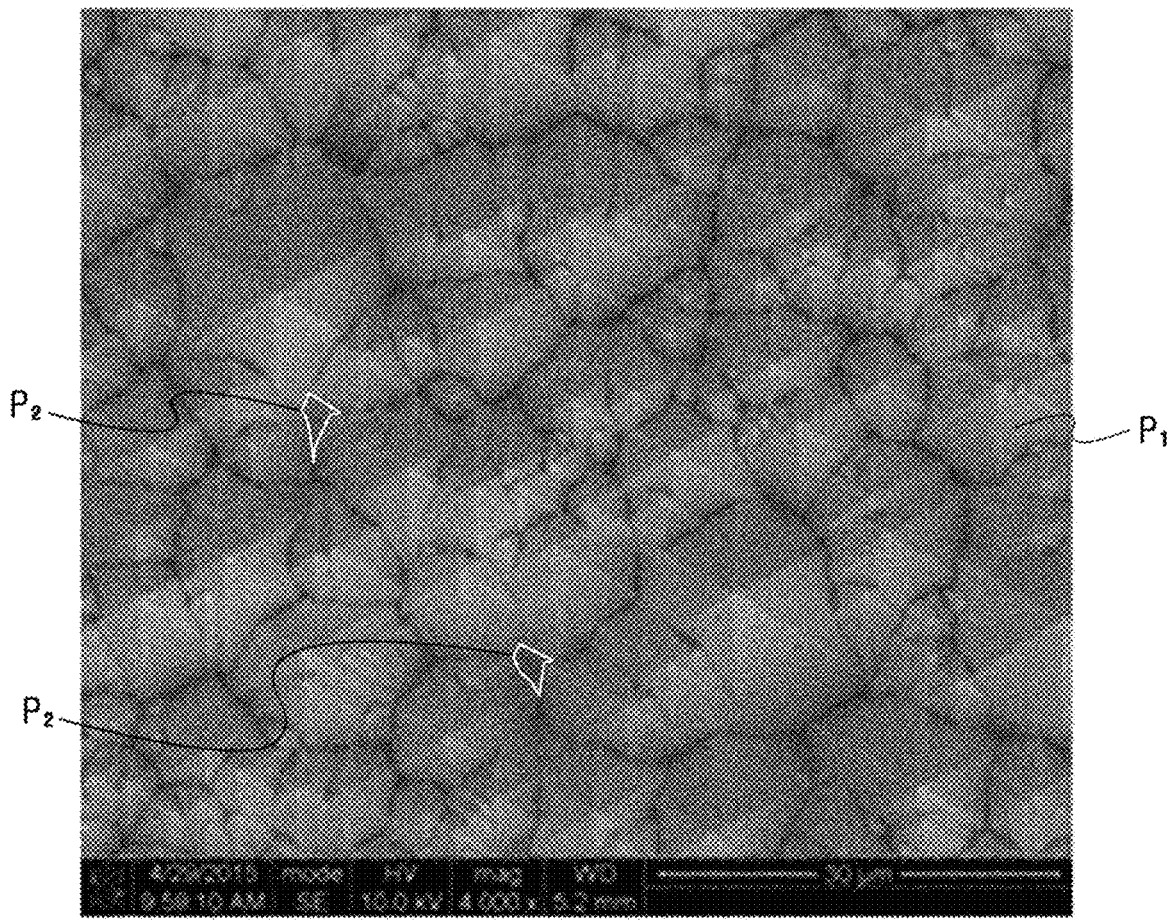
FIG. 7 is an image showing a case in which the area of the light extraction structures is 90% or more of the total area of the substrate.

FIG. 5 is an image showing a case in which an area of the light extraction structures is less than 60% of a total area of the substrate. FIG. 6 is an image showing a case in which the area of the light extraction structures is 60% or more and less than 90% of the total area of the substrate. FIG. 7 is an image showing a case in which the area of the light extraction structures is 90% or more of the total area of the substrate.

Referring to FIG. 5, the substrate 110 may have a first region P1 in which the plurality of light extraction structures are formed, and a second region P2 between the plurality of light extraction structures. The second region P2 may be a relatively even surface. The even surface may totally reflect light emitted from the light-emitting structure 120.

Referring to FIG. 5, when an average height of the light extraction structures is less than 10 μm, a second region having a large area can be observed. In the case of FIG. 5, a ratio of an area occupied by the first region P1 to the total area of the substrate is less than 60%. That is, since the light extraction structures do not grow to a large size, there are a plurality of empty regions between the light extraction structures. Since the area of the first region P1 is less than 60% of the total area of the substrate, light extraction efficiency can be relatively reduced. Here, the average height of the light extraction structures may be a value obtained by averaging heights of the plurality of light extraction structures located within an area of 100 μm×100 μm.

Referring to FIG. 6, it can be confirmed that when the average height of the light extraction structures 111 is 12 μm, an area of the second region is relatively reduced. In the case of FIG. 6, a ratio of the area occupied by the first region P1 to the total area of the substrate is 60% or more. The area of the first region P1 may be 60% or more and less than 90% of the total area of the substrate. In this case, the second region P2 is smaller when compared to FIG. 5, and light extraction efficiency can be increased.

Referring to FIG. 7, it can be seen that the second region P2 is mostly removed due to growing the light extraction structures. A ratio of the area occupied by the first region P1 to the total area of the substrate 110 is 90% or more. The average height of the light extraction structures 111 was measured and was 27 μm. As the height of the light extraction structures increases, a lower surface of the light extraction structures widens. Accordingly, the second region P2 is reduced.

However, it was confirmed that even when an etching time is further increased, the height of the light extraction structures does not further increase. An unevenness formed by wet etching has a specific angle/directionality. As time is increased, an area of the unevenness increases. However, when the unevenness comes into contact with a light extraction structure adjacent thereto, etching does not proceed further. Therefore, a maximum height of the light extraction structures may be 30 μm.

Figure 8:
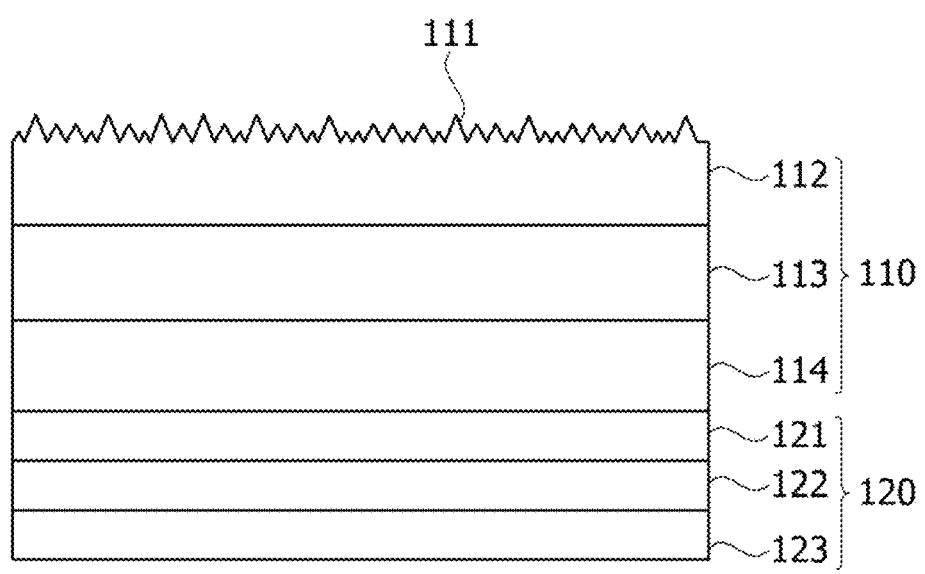
FIG. 8 is a view illustrating a doping concentration of a substrate of FIG. 1.
Figure 9:
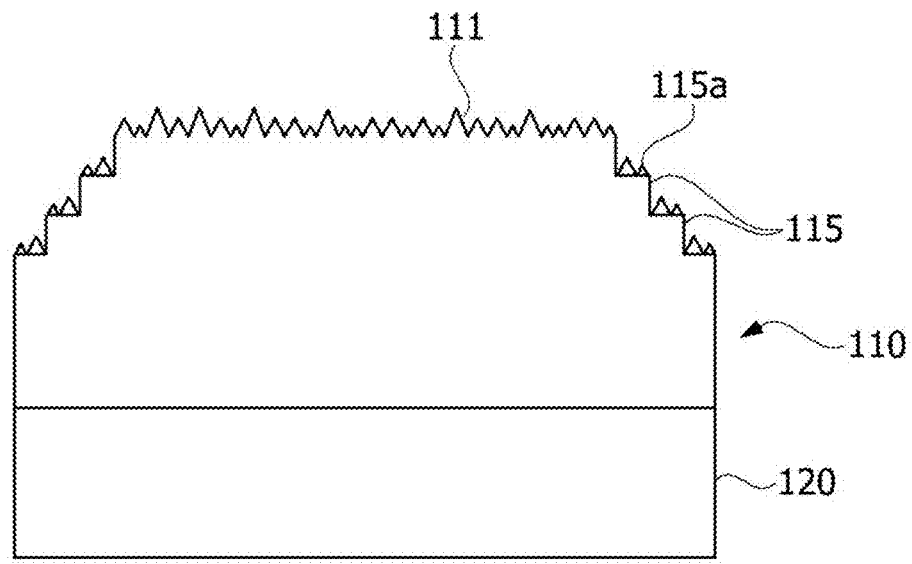
FIG. 9 is a view illustrating sub-light extraction structures formed on side surfaces of the substrate of FIG. 1.

FIG. 8 is a view illustrating a doping concentration of the substrate of FIG. 1, and FIG. 9 is a view illustrating sub-light extraction structures formed on side surfaces of the substrate of FIG. 1.

Referring to FIG. 8, the substrate 110 includes a first layer 114 facing the light-emitting structure 120, a second layer 112 having the light extraction structures 111, and a third layer 113 disposed between the first layer 114 and the second layer 112.

When a current is applied to the first semiconductor layer 121, the first layer 114 may form a current distribution path. The current can be effectively distributed through the first layer 114. Therefore, even when an area of an electrode in contact with the first semiconductor layer 121 is reduced, an operating voltage can be maintained. To this end, a doping concentration of the first layer 114 may be relatively high. Specifically, the doping concentration of the first layer 114 may be in a range of $1\times10^{18}$ cm$^{-3}$ to $5\times10^{19}$ cm$^{-3}$. A dopant may be selected from all of the various kinds of dopants doped on the first semiconductor layer 121.

A doping concentration of the second layer 112 may be the same as that of the first layer 114. As described above, the second layer 112 may form the light extraction structures 111 by wet etching. As a doping concentration becomes higher, Ga and N can be easily separated, thereby improving etching performance.

A doping concentration of the third layer 113 may be lower than that of each of the first layer 114 and the second layer 112. When a doping concentration is in a range of $1\times10^{18}$ cm$^{-3}$ to $5\times10^{19}$ cm$^{-3}$ throughout an entire thickness of the substrate 110, it is difficult to secure desired transparency and crystallinity. Therefore, the desired transparency and crystallinity can be secured in the substrate 110 by relatively lowering the doping concentration of the third layer 113. In an example, the doping concentration of the third layer 113 may be $1\times10^{16}$ cm$^{-3}$ or less, or the third layer 113 may not be doped with an n-type dopant.

A thickness of the first layer 114 may be 40% to 50%, a thickness of the third layer 113 may be 40% to 50%, and a thickness of the second layer 112 may be 10% to 20%, with respect to a total thickness of the substrate 110. In an example, when the thickness of the substrate 110 is 100 μm, the thickness of each of the first layer 114 and the third layer 113 may be 40 μm, and the thickness of the second layer 112 may be 20 μm.

Referring to FIG. 9, the substrate 110 may have a plurality of sub-light extraction structures 115a formed on the side surfaces in a thickness direction thereof. Such a structure can improve extraction efficiency toward the side surfaces of the substrate 110.

However, wet etching may be performed only on a surface in a specific direction of the substrate 110. Therefore, the substrate 110 according to an exemplary embodiment has stepped portions 115 formed on the side surfaces thereof, and the sub-light extraction structures 115a may be formed on upper surfaces (m-surfaces) of the stepped portions 115. A plurality of stepped portions 114 may be continuously formed from the one surface to the other surface of the substrate 110. A width, a height, and the like of the stepped portions 114 may be appropriately modified by taking into account extraction efficiency. When the sub-light extraction structure 115a is formed on the stepped portion 114 close to the light-emitting structure 120, although a height of the formed sub-light extraction structure 115a is small, the formed sub-light extraction structure 115a can have a light extraction effect. Therefore, as the sub-light extraction structure 115a gets closer to the light-emitting structure 120, a size of the sub-light extraction structure 115a may decrease.

Figure 10:
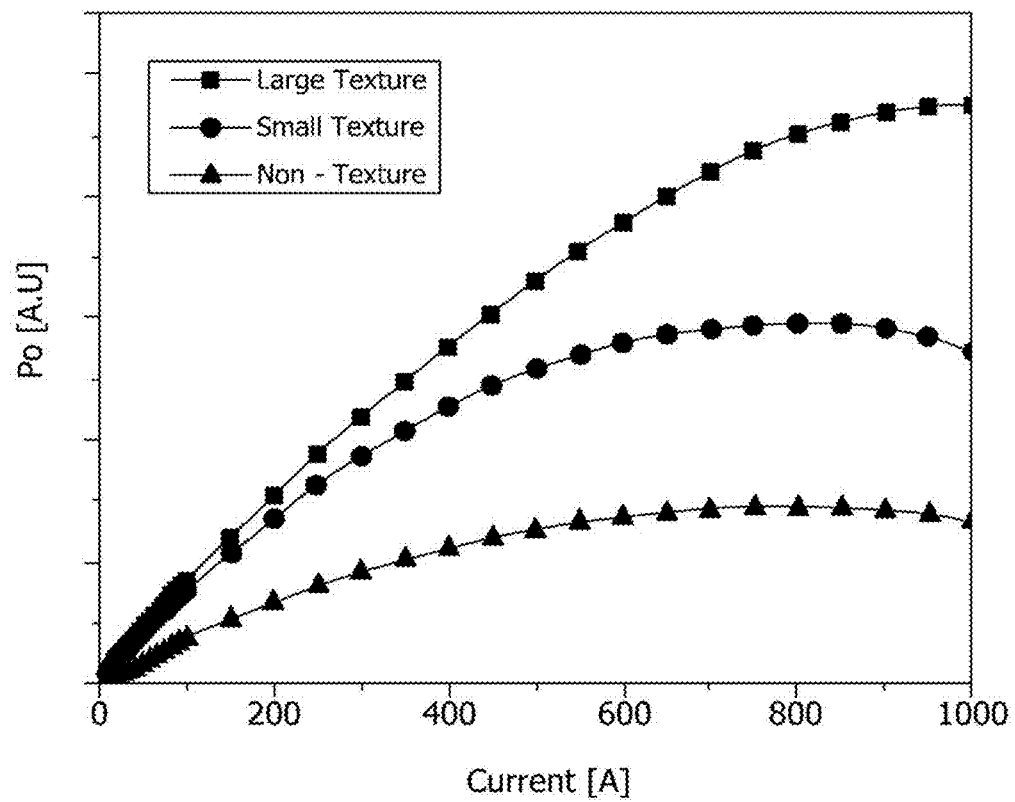
FIG. 10 is a graph showing a change in optical power (PO) according to a light extraction structure size.
Figure 11A:
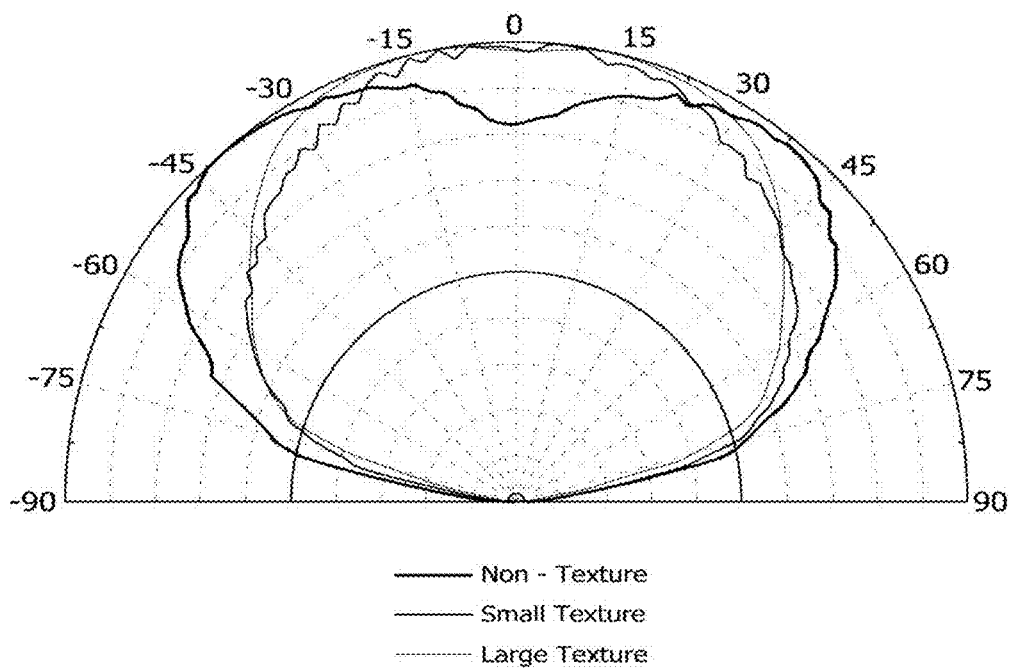
FIGS. 11A and 11B are graphs showing a change in orientation angle according to a light extraction structure size.
Figure 11B:
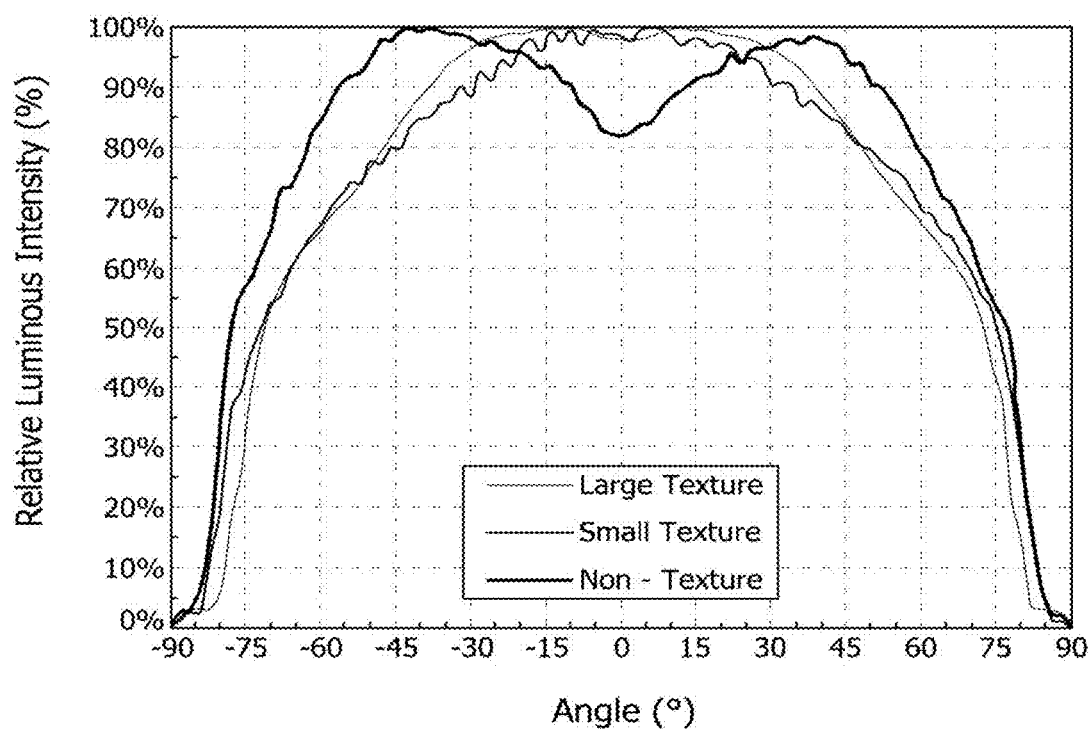

FIG. 10 is a graph showing a change in optical power (PO) according to a light extraction structure size. FIGS. 11A and 11B are graphs showing a change in orientation angle according to a light extraction structure size.

Referring to FIG. 10, in a case in which there is no light extraction structure 111 on the substrate 110, it can be confirmed that when an injected current is 400 A or more, luminescence characteristics are not improved, even though the injected current is increased beyond 400 A. In contrast, in a case in which the light extraction structure having a height of 12 μm is applied (small texture), it can be confirmed that luminescence efficiency are improved, and in a case in which the light extraction structure having a height of 27 μm is applied (large texture), it can be confirmed that luminescence efficiency are further improved.

Referring to FIGS. 11A and 11B, it can be seen that as the size of the light extraction structure 111 increases, an orientation angle is narrowed. FIG. 11A is a radial plot, and FIG. 11B is a Cartesian plot.

Referring to FIG. 11, an orientation angle is 154.6° in the case in which the there is no light extraction structure 111, an orientation angle is narrowed to 146.85° in the case in which the light extraction structure 111 having a height of 12 μm is formed, and, an orientation angle is narrowed to 142.7° in the case in which the light extraction structure having a height of 27 μm is formed. Therefore, it can be seen that the height of the light extraction structure 111 and the orientation angle are inversely proportional to each other. This means that light emission efficiency is increased in a vertical direction.

Figure 12:
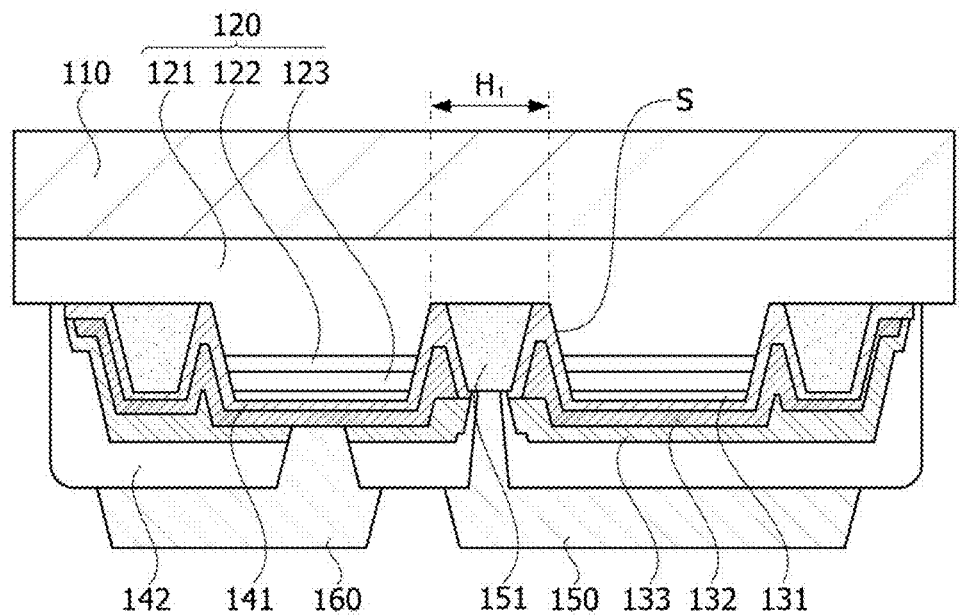
FIG. 12 is a view illustrating the light-emitting device of FIG. 1.
Figure 13:
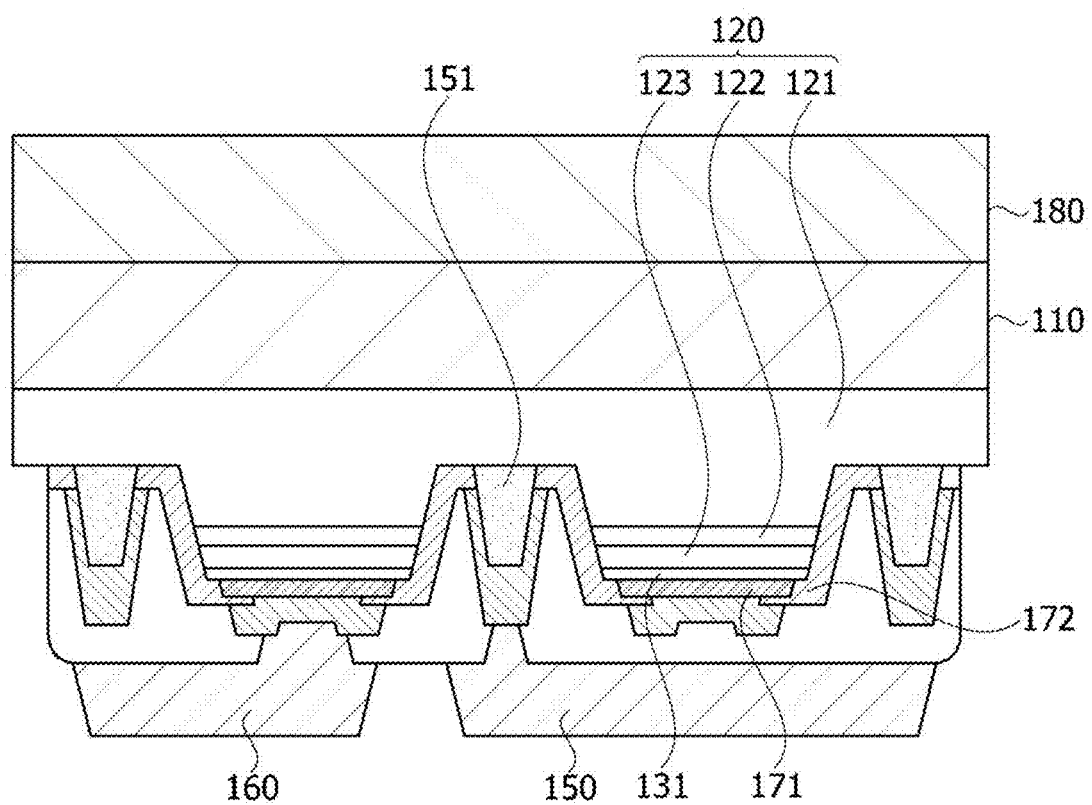
FIG. 13 is a view illustrating a configuration in which a wavelength conversion layer is disposed in the light-emitting device of FIG. 12.

FIG. 12 is a view illustrating the light-emitting device of FIG. 1, and FIG. 13 is a view illustrating a configuration in which a wavelength conversion layer is disposed in the light-emitting device of FIG. 12.

Referring to FIG. 12, the light-emitting structure 120 includes the first semiconductor layer 121, an active layer 122, and a second semiconductor layer 123. The first semiconductor layer 121 may be a III-V group or II-IV group compound semiconductor or the like, and may be doped with a first dopant. The first semiconductor layer 121 may be made of at least one material selected from semiconductor materials having an empirical formula of $In_{x1}Al_{y1}Ga_{1-x1-y1}N$ ($0 \leq x1 \leq 1$, $0 \leq y1 \leq 1$, and $0 \leq x1+y1 \leq 1$), such as GaN, AlGaN, InGaN, and InAlGaN. The first dopant may be an n-type dopant such as Si, Ge, Sn, Se, or Te. When the first dopant is the n-type dopant, the first semiconductor layer 121 doped with the first dopant may be an n-type semiconductor layer.

The active layer 122 is a layer in which electrons (or holes) injected through the first semiconductor layer 121 meet holes (or electrons) injected through the second semiconductor layer 123. As electrons and holes are recombined and transition to a low energy level, the active layer 122 may generate light having a wavelength corresponding thereto. There is no restriction on a light emission wavelength in the present exemplary embodiment.

The active layer 122 may have any one of a single well structure, a multi well structure, a single quantum well structure, a multi quantum well (MQW) structure, a quantum dot structure, and a quantum line structure, but a structure of the active layer 122 is not limited thereto.

The second semiconductor layer 123 may be implemented by using a III-V group or II-IV group compound semiconductor or the like, and may be doped with a second dopant. The second semiconductor layer 140 may be made of a semiconductor material having an empirical formula of $In_{x5}Al_{y2}Ga_{1-x5-y2}N$ ($0 \leq x5 \leq 1$, $0 \leq y2 \leq 1$, and $0 \leq x5+y2 \leq 1$), or may be made of a material selected from AlInN, AlGaAs, GaP, GaAs, GaAsP, and AlGaInP. When the second dopant is a p-type dopant such as Mg, Zn, Ca, Sr, or Ba, the second semiconductor layer 123 doped with the second dopant may be a p-type semiconductor layer.

Although not shown, an electron blocking layer (EBL) may be disposed between the active layer 122 and the second semiconductor layer 123. The EBL may block electrons supplied by the first semiconductor layer 121 from flowing into the second semiconductor layer 123, and thus may increase the likelihood of recombination of electrons and holes in the active layer 122.

A first groove H1 is formed in the light-emitting structure 120 so as to pass through the second semiconductor layer 123 and the active layer 122 and expose the first semiconductor layer 121. The first semiconductor layer 121 may be partially etched so as to form the first groove H1. A plurality of the first groove H1 may be provided. A first ohmic electrode 151 may be disposed in the first groove H1 and may be electrically connected to the first semiconductor layer 121. A second ohmic electrode 131 may be disposed on a lower portion of the second semiconductor layer 123.

The first ohmic electrode 151 and the second ohmic electrode 131 may include at least one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SnO, InO, INZnO, ZnO, IrOx, RuOx, NiO, Ti, Al, Ni, Cr, and a selective compound or alloy thereof, and may be formed in at least one layer. A thickness of the ohmic electrodes is not particularly limited.

A first insulating layer 141 may cover the other surface of the light-emitting structure 120 and sidewalls S of the first groove H1. The first insulating layer 141 may entirely cover the light-emitting structure 120 and the first ohmic electrode 151 except for a point at which the first ohmic electrode 151 is connected to a first electrode pad 150.

The first insulating layer 141 may include an insulating material or an insulating resin formed of at least one of oxides, nitrides, fluorides, and sulfides, which include at least one selected from Al, Cr, Si, Ti, Zn, and Zr. The first insulating layer 141 may be made of at least one selected from, for example, $SiO_2$, $Si_3N_4$, $Al_2O_3$, and $TiO_2$. The first insulating layer 141 may be formed in a single-layer or multiple layers, but the present invention is not limited thereto.

A reflective electrode layer 132 may be disposed on the first insulating layer 141 to cover the other surface of the light-emitting structure 120 and the sidewalls S of the first groove H1. The reflective layer may be formed entirely on the light-emitting structure 120 excluding a portion at which the first ohmic electrode 151 is connected to the first electrode pad 150. Due to such a configuration, most of the light emitted toward the second semiconductor layer 123 from the active layer 122 may be reflected toward the substrate 110. Therefore, reflection efficiency can be increased, and light extraction efficiency can be improved.

The reflective electrode layer 132 may be made of a metallic or non-metallic material. The metallic reflective electrode layer 132 may include any one metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

A non-metallic reflective layer may have a structure in which at least two of a pair including a first layer having a first refractive index and a second layer having a second refractive index are alternately stacked. The first refractive index and the second refractive index may be different from each other, and each of the first layer and the second layer may be made of a conductive material or an insulating material, which have a refractive index of 1.5 to 2.4. The structure may be a distributed Bragg reflection (DBR) structure. In addition, the structure may be a structure (omnidirectional reflector) in which a dielectric layer with a low refractive index and a metal layer are stacked.

A light extraction structure such as a roughness may be formed on a surface of at least one of the second semiconductor layer 123 and the reflective electrode layer 132. Such a light extraction structure can improve light extraction efficiency by changing a critical angle of incident light. The light extraction structure may have uneven patterns or a plurality of protrusions.

A capping electrode 133 may be disposed on a lower portion of the reflective electrode layer 132. The capping electrode 133 may perform at least one of a role as a diffusion prevention layer, a role as a current distribution layer, and a role of protecting the reflective electrode layer 132. The capping electrode 133 may be made of one selected from Au, Cu, Hf, Ni, Mo, V, W, Rh, Ru, Pt, Pd, La, Ta, Ti, Al, and an alloy of at least two thereof.

A second insulating layer 142 is disposed on a lower portion of the capping electrode 133. The second insulating layer 142 may include an insulating material or an insulating resin made of at least one of oxides, nitrides, fluorides, and sulfides, which include at least one selected from Al, Cr, Si, Ti, Zn, and Zr. The second insulating layer 142 may be made of at least one selected from, for example, $SiO_2$, $Si_3N_4$, $Al_2O_3$, and $TiO_2$. The second insulating layer 142 may be formed in a single-layer or multiple layers, but the present invention is not limited thereto.

The first electrode pad 150 may penetrate the second insulating layer 142 and may be electrically connected to the first ohmic electrode 151. An area of the first ohmic electrode 151 gradually increases toward the substrate 110, and an area of the first electrode pad 150 gradually decreases toward the substrate 110.

A second electrode pad 160 may penetrate the second insulating layer 142 and may be electrically connected to the second ohmic electrode 131 and the reflective electrode layer 132.

The first electrode pad 150 and the second electrode pad 160 may include any one metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

Referring to FIG. 13, a wavelength conversion layer 180 may be disposed on the substrate. Light having a blue wavelength band, emitted from the active layer 122, may be converted into white light by the wavelength conversion layer 180. The wavelength conversion layer 180 may be disposed on side surfaces of the substrate and side surfaces of the light-emitting structure. A package having such a structure may be a chip scale package (CSP).

The wavelength conversion layer 180 may be formed by dispersing a fluorescent material, a quantum dot, or the like in a polymer resin. The kind of fluorescent material is not particularly limited. The fluorescent material may include any one selected from a YAG-based fluorescent material, a TAG-based fluorescent material, a silicate-based fluorescent material, a sulfide-based fluorescent material, and a nitride-based fluorescent material.

The light-emitting device according to the exemplary embodiment may be used as a light source of various devices. In an example, the light-emitting device may further include optical members, such as a light guide plate, a prism sheet, and a diffusion sheet, to function as a backlight unit. In addition, the light-emitting device according to the exemplary embodiment may be further applied to a display device, a lighting device, and an indicating device.

Here, the display device may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may constitute a backlight unit.

The reflective plate is disposed on the bottom cover, and the light emitting module emits light. The light guide plate is disposed in front of the reflective plate and guides light emitted from the light emitting module in a forward direction, and the optical sheet includes a prism sheet and the like and is disposed in front of the light guide plate. The display panel is disposed in front of the optical sheet, the image signal output circuit supplies an image signal to the display panel, and the color filter is disposed in front of the display panel.

The lighting device may include a substrate, a light source module including the light-emitting device according to the exemplary embodiment, a heat dissipater for dissipating heat of the light source module, and a power supply for processing or converting an electrical signal supplied from the outside and supplying the processed or converted electrical signal to the light source module. In addition, the lighting device may include a lamp, a head lamp, a street lamp, or the like.

The above-described present invention is not limited to the above-described exemplary embodiments and the drawings, and it should be apparent to those skilled in the art that various substitutions, modifications, and variations are possible within a range that does not depart from the technical idea of the exemplary embodiment.

The invention claimed is:

1. A light-emitting device comprising:
a gallium nitride substrate; and
a light-emitting structure disposed on one surface of the substrate, the light-emitting structure including:
a first semiconductor layer that faces the gallium nitride substrate,
a second semiconductor layer,
an active layer between the first semiconductor layer and the second semiconductor layer,
a first electrode that is electrically connected to the first semiconductor layer, and the first semiconductor layer is between the first electrode and the gallium nitride substrate, and
a second electrode that is electrically connected to the second semiconductor layer, and the first semiconductor layer is between the second electrode and the gallium nitride substrate,
wherein the substrate has a plurality of light extraction structures disposed on the other surface thereof, a thickness of the substrate is 80 µm to 300 µm, and an average height of the plurality of light extraction structures is greater than 10 µm and is less than 30 µm,
wherein the substrate comprises a first layer facing the first semiconductor layer of the light-emitting structure, a second layer having the plurality of light extraction structures that extend in a direction away from the first and second electrodes, and a third layer disposed between the first layer and the second layer,
wherein a doping concentration of the third layer is lower than a doping concentration of the first layer and is lower than a doping concentration of the second layer,
wherein the doping concentration of the third layer is $1 \times 10^{16}$ $cm^{-3}$ or less,
wherein a thickness of the third layer is greater than a thickness of the second layer.

2. The light-emitting device of claim 1, wherein the substrate has a first region in which the plurality of light extraction structures are formed, and a second region between the plurality of light extraction structures.

3. The light-emitting device of claim 2, wherein the second region has an even surface.

4. The light-emitting device of claim 2, wherein an area of the first region is 60% or more of a total area of the substrate.

5. The light-emitting device of claim 2, wherein an area of the first region is 90% or more of a total area of the substrate.

6. The light-emitting device of claim 1, wherein the plurality of light extraction structures have a hexagonal shape.

7. The light-emitting device of claim 6, wherein a bottom side and a side surface of each of the plurality of light extraction structures have the same angle of incline.

8. The light-emitting device of claim 1, wherein the substrate has a plurality of sub-light extraction structures formed on side surfaces of the substrate.

9. The light-emitting device of claim 8, wherein the substrate has stepped portions disposed on the side surfaces of the substrate, and
a separate one of the plurality of sub-light extraction structures is disposed on an upper surface of each of the stepped portions.

10. The light-emitting device of claim 1, wherein a doping concentration of the first layer is in a range of $1\times10^{18}$ cm$^{-3}$ to $5\times10^{19}$ cm$^{-3}$.

11. The light-emitting device of claim 1, wherein a doping concentration of the second layer is in a range of $1\times10^{18}$ cm$^{-3}$ to $5\times10^{19}$ cm$^{-3}$.

12. A light-emitting device package comprising:
a light-emitting device; and
a wavelength conversion layer configured to convert light emitted by the light-emitting device,
wherein the light-emitting device comprises a gallium nitride substrate, and a light-emitting structure disposed on one surface of the substrate, the light-emitting structure including:
a first semiconductor layer that faces the gallium nitride substrate,
a second semiconductor layer,
an active layer between the first semiconductor layer and the second semiconductor layer,
a first electrode that is electrically connected to the first semiconductor layer, and the first semiconductor layer is between the first electrode and the gallium nitride substrate, and
a second electrode that is electrically connected to the second semiconductor layer, and the first semiconductor layer is between the second electrode and the gallium nitride substrate,
wherein the substrate has a plurality of light extraction structures disposed on the other surface thereof, a thickness of the substrate is 80 μm to 300 μm, and an average height of the plurality of light extraction structures is greater than 10 μm and is less than 30 μm,
wherein the substrate comprises a first layer facing the first semiconductor layer of the light-emitting structure, a second layer having the plurality of light extraction structures that extend in a direction away from the first and second electrodes, and a third layer disposed between the first layer and the second layer,
wherein a doping concentration of the third layer is lower than a doping concentration of the first layer and is lower than a doping concentration of the second layer,
wherein the doping concentration of the third layer is $1\times10^{16}$ cm$^{-3}$ or less,
wherein a thickness of the third layer is greater than a thickness of the second layer.

13. A display device using the light-emitting device of claim 1 as a light source.

14. The light-emitting device package of claim 12, wherein the substrate has a plurality of sub-light extraction structures formed on side surfaces of the substrate.

15. The light-emitting device package of claim 14, wherein the substrate has stepped portions disposed on the side surfaces of the substrate, and
a separate one of the plurality of sub-light extraction structures is disposed on an upper surface of each of the stepped portions.

16. The light-emitting device package of claim 15, wherein the stepped portions include a first stepped portion and a second stepped portion, the second stepped portion being closer to the light-emitting structure than the first stepped portion,
wherein a first sub-light extraction structure is provided on the first stepped portion, and a second sub-light extraction structure is provided on the second stepped portion, and
a height of the first sub-light extraction structure is greater than a height of the second sub-light extraction structure.

17. The light-emitting device package of claim 9, wherein the stepped portions include a first stepped portion and a second stepped portion, the second stepped portion being closer to the light-emitting structure than the first stepped portion,
wherein a first sub-light extraction structure is provided on the first stepped portion, and a second sub-light extraction structure is provided on the second stepped portion, and
a height of the first sub-light extraction structure is greater than a height of the second sub-light extraction structure.

* * * * *